US009026963B1

(12) United States Patent
O'Riordan et al.

(10) Patent No.: US 9,026,963 B1
(45) Date of Patent: May 5, 2015

(54) SYSTEM AND METHOD FOR FAULT SENSITIVITY ANALYSIS OF MIXED-SIGNAL INTEGRATED CIRCUIT DESIGNS

(71) Applicant: Cadence Design Systems, Inc., San Jose, CA (US)

(72) Inventors: Donald J. O'Riordan, Sunnyvale, CA (US); Ilya Yusim, San Jose, CA (US); Zhipeng Liu, Beijing (CA)

(73) Assignee: Cadence Design Systems, Inc., San Jose, CA (US)

( * ) Notice: Subject to any disclaimer, the term of this patent is extended or adjusted under 35 U.S.C. 154(b) by 5 days.

(21) Appl. No.: 14/187,794

(22) Filed: Feb. 24, 2014

Related U.S. Application Data

(63) Continuation of application No. 13/683,810, filed on Nov. 21, 2012, now Pat. No. 8,683,400.

(51) Int. Cl.
*G06F 9/455* (2006.01)
*G06F 17/50* (2006.01)

(52) U.S. Cl.
CPC .................................. *G06F 17/5022* (2013.01)

(58) Field of Classification Search
CPC ...................... G01R 31/31835; G01R 31/2846; G01R 31/318342; G01R 31/2894; G01R 31/318583; G01R 31/275; G01R 31/2806; H01L 22/20
USPC ................................ 716/106, 136; 703/13, 14
See application file for complete search history.

(56) References Cited

U.S. PATENT DOCUMENTS

| | | | |
|---|---|---|---|
| 4,937,765 A * | 6/1990 | Shupe et al. | 702/187 |
| 5,084,824 A | 1/1992 | Lam et al. | |
| 5,157,668 A | 10/1992 | Buenzli, Jr. et al. | |
| 5,325,309 A | 6/1994 | Halaviati et al. | |
| 5,475,695 A | 12/1995 | Caywood et al. | |
| 6,009,251 A | 12/1999 | Ho et al. | |
| 6,035,114 A * | 3/2000 | Tseng et al. | 703/13 |
| 6,611,948 B1 * | 8/2003 | Tyler et al. | 716/113 |
| 7,103,434 B2 | 9/2006 | Chernyak et al. | |
| 7,117,471 B1 | 10/2006 | Li et al. | |
| 7,296,249 B2 | 11/2007 | Rinderknecht et al. | |
| 7,472,051 B2 * | 12/2008 | Mariani et al. | 703/13 |
| 7,562,321 B2 | 7/2009 | Wang et al. | |
| 7,716,611 B2 | 5/2010 | Pikus et al. | |
| 2004/0060017 A1* | 3/2004 | Abdennadher | 716/4 |
| 2006/0041417 A1* | 2/2006 | Palladino | 703/14 |
| 2008/0276206 A1* | 11/2008 | Mariani | 716/4 |
| 2010/0229061 A1 | 9/2010 | Kapke et al. | |
| 2010/0257494 A1* | 10/2010 | Pouarz et al. | 716/5 |

(Continued)

OTHER PUBLICATIONS

Piet Engelke et al., "Resistive Bridging Fault Simulation of Industrial Circuits", Design, Automation and Test in Europer, Aug. 2008, p. 628-633.

(Continued)

*Primary Examiner* — Brian Ngo
(74) *Attorney, Agent, or Firm* — Kenyon & Kenyon LLP

(57) ABSTRACT

An apparatus and method for conducting fault sensitivity analysis of the analog portions of a mixed signal circuit design includes simulating the fault free circuit design, inserting a fault into the analog portion of the circuit design, simulating the circuit design with the fault during a fault interval time period, and determining whether the fault is detectable.

19 Claims, 8 Drawing Sheets

(56) References Cited

U.S. PATENT DOCUMENTS

2013/0054161 A1 2/2013 Kapke et al.
2014/0059507 A1 2/2014 Sunter

OTHER PUBLICATIONS

Yuyun Liao and D.M.H, Walker, "Fault Coverage Analysis for Physically-Based CMOS Bridging Faults at Different Power Supply Voltages", Proceedings 1996 IEEE International Test Conference, Test and Design Validity, Washington, D.C., USA, Oct. 20-25, 1996, p. 767-775.
R. Rodriguez-Montanes, E.M.J.G. Bruls, J. Figueras, "Bridging Defects Resistance Measurements in a CMOS Process", Proceedings, IEEE International Test Conference 1992, Paper 41.3, 0-8186-3167, Aug. 1992, p. 892-899.
Vijay R. Sar-Dessai and D.M.H. Walker, "Resistive Bridge Fault Modeling, Simulation and Test Generation", Proceedings, 1999 IEEE ITC International Test Conference, Paper 23.2, 0-7803-5753, Jan. 1999, p. 596-605.
Bram Kruseman et al., "Defect Oriented Testing for Analog/Mixed-Signal Devices", 2011 IEEE International Test Conference, Paper 1.1, 978-1-4577-0152, Aug. 2011, p. 1-10.
Mei, Kenyon C.Y., "Bridging and Stuck-At Faults," IEEE Transaction on Computers. vol. c-23, No. 7, Jul. 1974, pp. 720-727.
Ferguson, F. Joel, et al., "Test Pattern Generation for Realistic Bridge Faults in CMOS ICs," IEEE International Test Conference, Oct. 1991, pp. 492-499.
Spinner, Stefan, et al., "Automatic Test Pattern Generation for Interconnect Open Defects," 26th IEEE VLSI Test Symposium, Apr. 2008, pp. 181-186.
Waicukauski, John A., et al., "Transition Fault Simulation," IEEE Design & Test of Computers. Apr. 1987, pp. 32-38.
Pomeranz, Irith, et al., "On n-Detection Test Sets and Variable n-Detection Test Sets for Transition Faults," in Proc. of VTS, Apr. 1999, pp. 173-180.
Geuzebroek, Jeroen, et al., "Embedded Multi-Detect ATPG and Its Effect on the Detection of Unmodeled Defects," IEEE ITC, Oct. 2007, paper 30.3, pp. 1-10.
Cho, Kyoung Youn, et al., "Gate Exhaustive Testing," IEEE, ITC, paper 31.3, Nov. 2005, pp. 1-7.
Hapke, F., et al., "Defect-Oriented Cell-Aware ATPG and Fault Simulation for Industrial Cell Libraries and Designs," IEEE ITC, Nov. 2009, paper 1.2, pp. 1-10.
Hapke, F., et al., "Cell-Aware Production Test Results From a 32-nm Notebook Processor," IEEE ITC, Nov. 2012, paper 1.1, pp. 1-9.

* cited by examiner

SYSTEM AND METHOD FOR FAULT SENSITIVITY ANALYSIS OF MIXED-SIGNAL INTEGRATED CIRCUIT DESIGNS

CROSS REFERENCE TO RELATED APPLICATIONS

The present application is a continuation of U.S. application Ser. No. 13/683,810, entitled "System and Method For Fault Sensitivity Analysis Of Mixed-Signal Integrated Circuit Designs", filed on Nov. 21, 2012.

The present application is related to U.S. application Ser. No. 13/683,853, entitled "System and Method For Fault Sensitivity Analysis Of Digitally-Calibrated-Circuit Designs", filed on Nov. 21, 2012. This related application is hereby incorporated by reference in its entirety.

The present application also is related to U.S. application Ser. No. 13/683,889, entitled "Analog Fault Visualization System and Method For Circuit Designs", filed on Nov. 21, 2012. This related application is hereby incorporated by reference in its entirety.

BACKGROUND

The integrated circuit ("IC") industry faces the challenge of reducing yield loss caused by defects during manufacturing. These defects can be either random defects or systematic defects. Random defects, as the name implies, result from random occurrences such as particulate contamination. Systematic defects are non-random and result from problems with the manufacturing process and/or IC design. Systematic defects will recur when a manufacturer uses a similar process or IC pattern. A designer may be able to categorize or anticipate certain systematic defects based on a shape or feature pattern on an IC.

To aid in diagnosing the root causes of defects, companies have developed tools to simulate faults generated by the defects in digital ICs. These tools help designers and/or manufacturers reduce the number of defects in digital ICs and thereby reduce yield loss. However, these tools conduct logic-level simulations which are inapplicable to analog circuitry. In the past, circuit designers focused on ICs with mainly digital circuitry, so there were relatively few analog circuitry faults to diagnose. Thus, a designer could diagnose faults in analog circuitry through in-line inspection.

Today, the IC industry is developing more and more mixed signal ICs with substantial amounts of analog circuitry. The IC industry is also moving to smaller and smaller IC features. Manufacturing mixed signal ICs with sub-90 nm processes have many subtle design-process variations which increase the types of systematic defects present in analog circuitry. As a result, designers are unable to adequately diagnose all of the new defect types using in-line inspection. Designers, therefore, need a better tool for diagnosing faults in analog circuitry.

DETAILED DESCRIPTION

As will be described hereinafter in greater detail, one aspect of the present invention relates to a mixed signal fault sensitivity analysis system and method for accurately analyzing faults in the analog portions of a mixed-signal IC. For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

Figure 1:
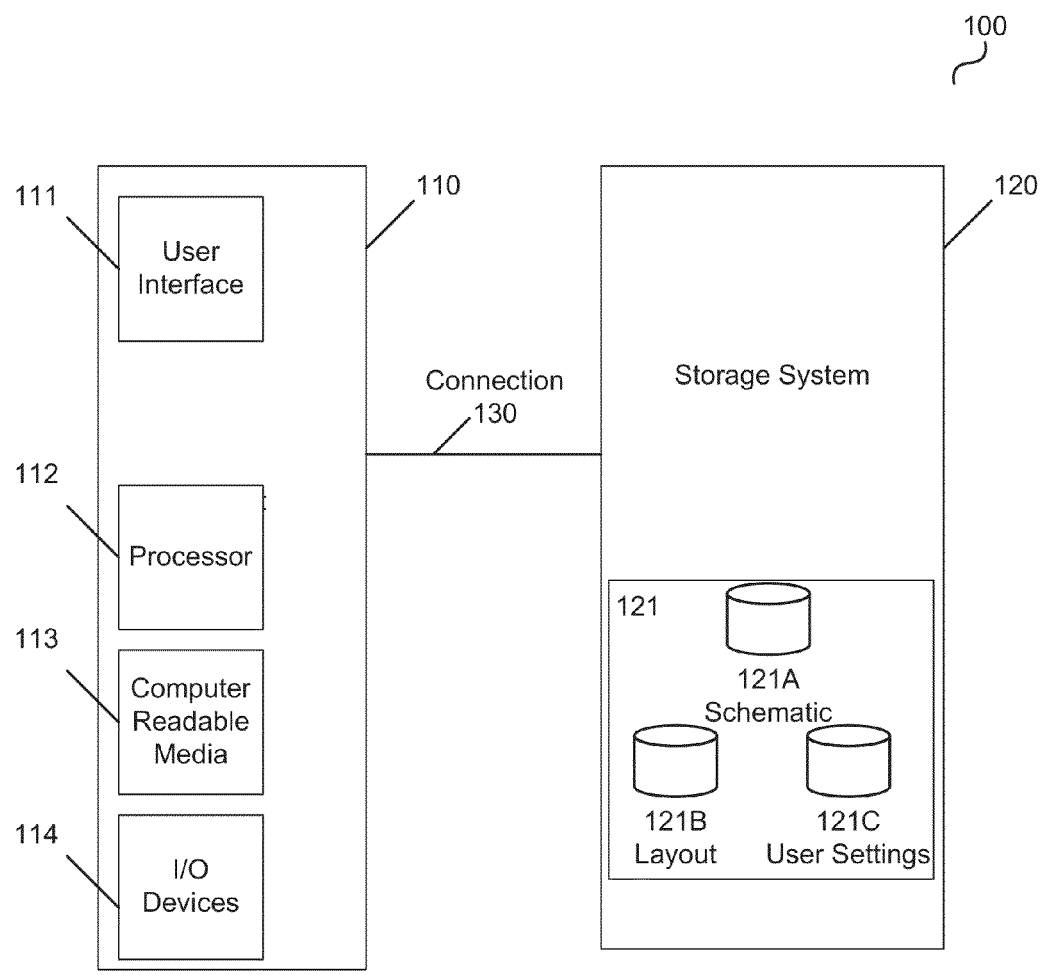
FIG. 1 is a block diagram illustrating components of an exemplary analog fault sensitivity analysis system 100 according to an embodiment.

FIG. 1 is a block diagram illustrating components of an exemplary analog fault sensitivity analysis system 100 according to an embodiment. This system may provide simulator functionality, as will be discussed in greater detail below. A user may access the analog fault sensitivity analysis system 100 through a standalone client system, client-server environment, or a network environment. System 100 may comprise one or more clients or servers 110, one or more storage systems 120, and a connection or connections 130 between and among these elements.

Client 110 may execute instructions stored on a computer readable medium that provides a user interface 111 which allows a user to access storage system 120. According to an aspect of an embodiment, the instructions may be part of a software program or executable file that operates EDA software. Client 110 may be any computing system, such as a personal computer, workstation, or other device employing a processor which is able to execute programming instructions. User interface 111 may be a GUI run in a user-controlled application window on a display. A user may interact with user interface 111 through one or more input/output (I/O) devices 114 such as a keyboard, a mouse, or a touch screen.

Storage system 120 may take any number of forms, including but not limited to a server with one or more storage devices attached to it, a storage area network, or one or a plurality of non-transitory computer readable media. In an aspect of one embodiment, databases 121 may be stored in storage system 120 such that they may be persistent, retrieved, or edited by the user. Databases 121 may include a schematic database 121A, a layout database 121B, and a user input database 121C. These databases may be kept as separate files or systems, or may be merged together in any appropriate combination.

According to an aspect of an embodiment, only one client 110 is connected to storage system 120 through connection 130, which may be a simple direct wired or wireless connection, a system bus, a network connection, or the like, to provide client 110 with access to storage system 120. In another aspect, connection 130 may enable multiple clients 110 to connect to storage system 120. The connection may be part of a local area network, a wide area network, or another type of network, again providing one or more clients with access to storage system 120. Depending on system administrator settings, client 110's access to system storage 120 or to other clients may be limited.

Figure 2:
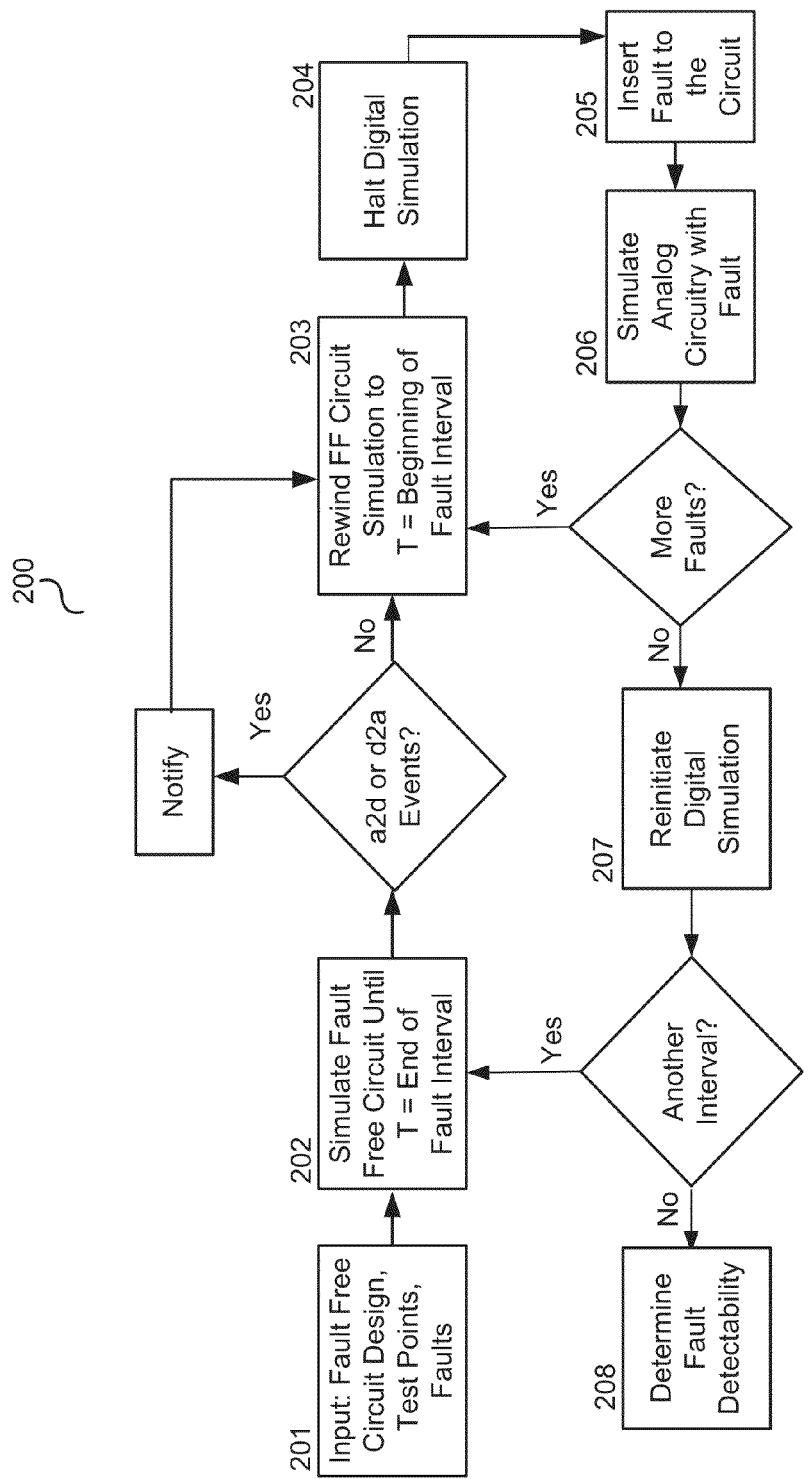
FIG. 2 is a flow chart illustrating one method of implementing the mixed signal fault sensitivity analysis which is optimized to ignore analog to digital and digital to analog events.

FIG. 2 is a flow chart illustrating a method of implementing a mixed signal fault sensitivity analysis (FSA) 200 optimized for analyzing fault intervals without analog to digital or digital to analog interface events. Analog to digital and digital to analog events may occur when an analog circuitry state affects the digital circuitry of the mixed-signal IC and vice versa.

At 201 a user provides a fault free circuit design with desired test points and faults for simulation. The fault free circuit design may be in the form of a schematic or a layout. The schematic or layout may be provided in any desired data format. In one embodiment, the schematic or layout may be in a format, sometimes referred to as a netlist, that provides a textual coded description of every element, part, device, and connection in the schematic or layout. The test points may include faults, time intervals in the circuit simulation for injecting faults, circuit nodes, and circuit load inputs. The time intervals may be specific windows of time during the simulation where analysis of a fault occurs. Circuit nodes may be an intersection where two or more circuit elements are connected. The circuit load inputs may include voltages, currents, load operating frequencies, etc.

At 202, a mixed signal simulator simulates the fault free circuit from an initial time point until the end of a fault injection interval time period. The mixed signal simulator may be any simulator which may simulate the characteristics of a circuit design in response to an application of a simulated load. The mixed signal simulator may be part of an EDA software application. As noted earlier, the system 100 in FIG. 1 may function as a simulator, among other things. The initial time point may be user specified, or may be some time when a load is applied to the circuit. During the simulation, the simulator records the states of the fault free circuit. The simulation of the fault free circuit provides the circuit response of an ideal circuit based on the circuit design over a period of time. The simulator also records any analog to digital (a2d) or digital to analog (d2a) interface events that occur during the fault injection interval. If the simulator records any analog to digital or digital to analog events during the fault injection interval, the simulator notifies the user that the analysis may not be accurate. The fault analysis using FSA 200 may not be accurate because it ignores the analog to digital and digital to analog events. FSA 200 assumes that the analog and digital circuits during the fault interval are decoupled.

At 203, FSA 200 rewinds the fault free (FF) circuit simulation to the beginning of the fault injection interval. Rewinding the fault free simulation to the beginning of the fault injection point may be achieved by using the state of the circuit design at the desired time point for the fault free circuit simulation. At 204, FSA 200 halts the digital portion of the mixed signal simulator. In one embodiment, the mixed signal simulator may use separate engines or kernels for simulating digital and analog circuitry. In such an embodiment, the digital portion of the mixed signal simulator may be halted by freezing the digital simulation engine or kernel.

At 205, FSA 200 injects a fault into the analog portion of the fault free circuit for simulating a faulty circuit. In one embodiment, the user input at 201 provides information pertaining to the portion of the circuit design where the fault will be inserted. FSA 200 may insert a fault by inserting high/low value resistors into the circuit design to represent an open/short circuit.

At 206, using the circuit state of the fault free circuit simulation at the beginning of the fault interval, FSA 200 simulates the analog circuitry of the faulty circuit until the end of the fault injection interval. In one embodiment, the analog circuitry is simulated using the analog simulator kernel of a mixed-signal simulator. During the simulation, the mixed-signal simulator records the states of the faulty circuit. In one embodiment, the state of the faulty circuit is only recorded for the very end of the interval.

203-206 are repeated for every fault to be simulated at that interval. Once the simulator has simulated every fault for the first fault interval, the digital kernel is reinitiated at step 207. The simulator, using the original fault free state, continues the fault free simulation until the next fault injection interval. FSA 200 then repeats 202-206 for every fault injection interval. Once FSA 200 finishes simulating every fault at every fault interval, FSA 200 moves on to 208, when FSA 200 determines whether any of the faults were detectable by comparing the fault free circuit simulation against all the faulty circuit simulations. In one embodiment, FSA 200 may only compare circuit values recorded at the end of the fault interval. FSA 200 may consider a fault detectable if the differences in the fault free scenario and the faulty scenario pass a certain threshold value. The threshold value may be part of the user input in 201. In one embodiment, the fault solution for a node that is coupled to a mixed-signal net may be converted to its logic value and compared to the logic value in the fault free solution. FSA 200 may flag that particular fault detectable if the logic value is different. In another embodiment, FSA 200 may record CPU time required to simulate a faulty circuit and compare it to the CPU time required to simulate the fault free circuit. Differences in CPU time may be used to determine a fault. For example, if the CPU time for simulating a faulty circuit grossly exceeded the CPU time for the fault free circuit, this may be flagged as a detectable fault. As part of its detection analysis, FSA 200 also may take into account whether any unexpected analog to digital events occurred. FSA 200 may deem the occurrence of an unexpected analog to digital event as a potentially detectable fault. In an alternative embodiment FAS 200 only determines that unexpected analog to digital events which affect the digital portions of the IC as a potentially detectable fault.

Figure 3:
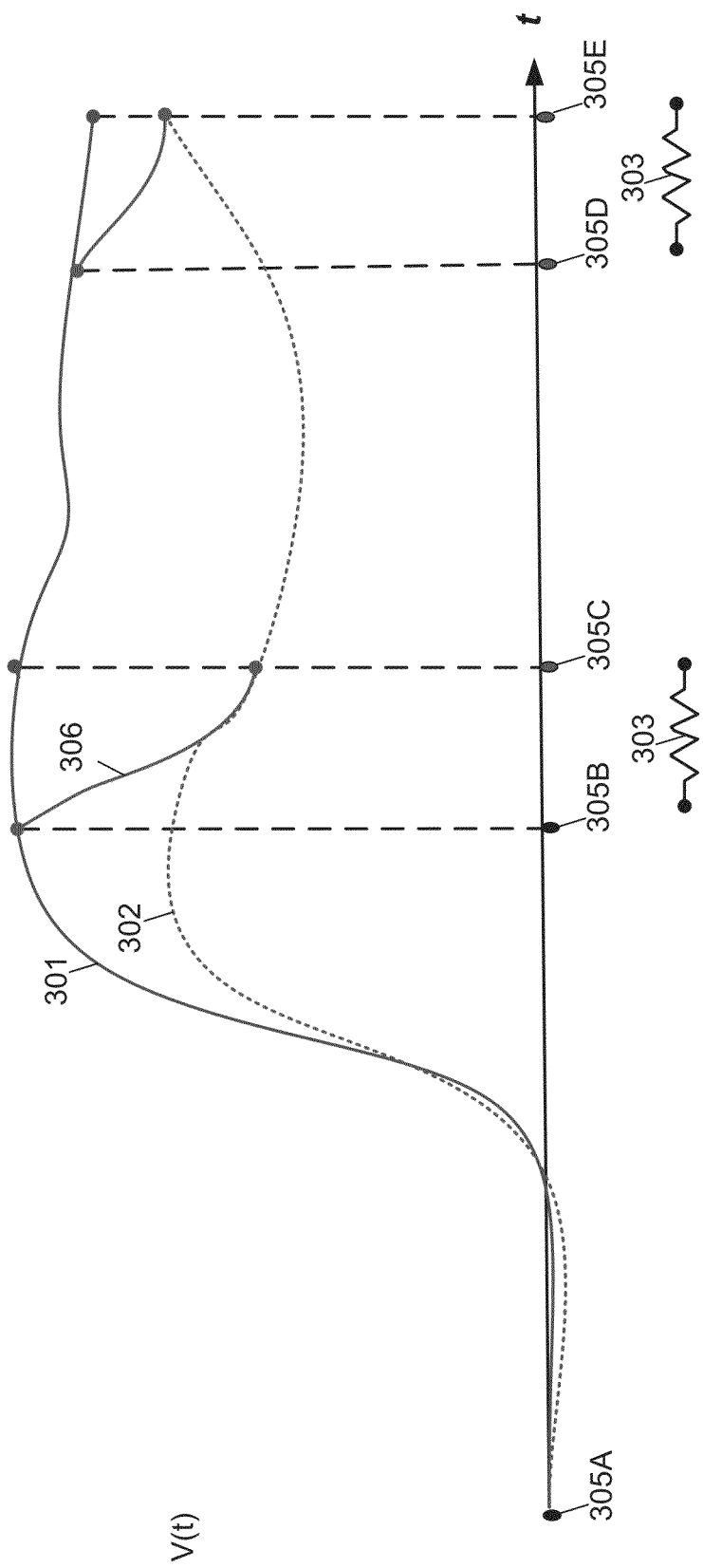
FIG. 3 is an exemplary transient graph of a simulated circuit behavior used to describe the mixed signal fault sensitivity analysis method used in FIG. 2.

FIG. 3 is an exemplary transient graph of a circuit. The transient graph is useful for visualizing the mixed signal fault sensitivity analysis 200 used in FIG. 2. FIG. 3 is used to trace the simulation portion of FSA 200 in FIG. 2 along a graph of a circuit's transient values. FIG. 3 shows a graph of a simulated circuit's voltage response (y axis) over time (x axis). There are many ways to graph transient solutions, including but not limited to current over time and frequency over time. FIG. 3 is only provided as a visual aid for demonstrating an implementation of the fault sensitivity analysis method applied in FIG. 2. Referring to FIG. 3, solid line 301 graphs the voltage response of the fault free circuit during simulation. Dashed line 302 represents the voltage response if a circuit with fault 303 existed. Interval 305B to 305C and 305D to 305E are the intervals used for injecting fault 303.

FIG. 3 is used to trace the simulation portion of FSA 200 in FIG. 2 along a graph of a circuit's transient values. FSA 200 starts by simulating the fault free circuit from start time 305A to the end of the first fault interval at 305C. Solid line 301 from 305A to 305C represents the circuit states for that portion of the simulation. If there had been an analog to digital or digital to analog event within the fault injection interval 305B to 305C, FSA 200 would have produced a warning. However, in this example, FSA 200 would not produce a warning because there are no analog to digital or digital to analog events within the interval. Next FSA 200 rewinds the simulation to the fault free solution at 305B, and freezes the digital kernel of the mixed signal simulator. FSA 200 then inserts a fault into the circuit and simulates the analog circuitry of the now faulty circuit until 305C. Line 306 represents FSA 200's solution of the faulty circuit. If there were any additional faults, FSA 200 would analyze them in the same way. Once simulation of all the faulty circuits is complete, FSA 200 unfreezes the digital kernel and continues the fault free simulation until 306D, as represented by solid line 301 between 305C to 306D. FSA then does a similar analysis for the next fault injection interval 306D to 306E as it did with the previous fault injection interval.

Figure 4:
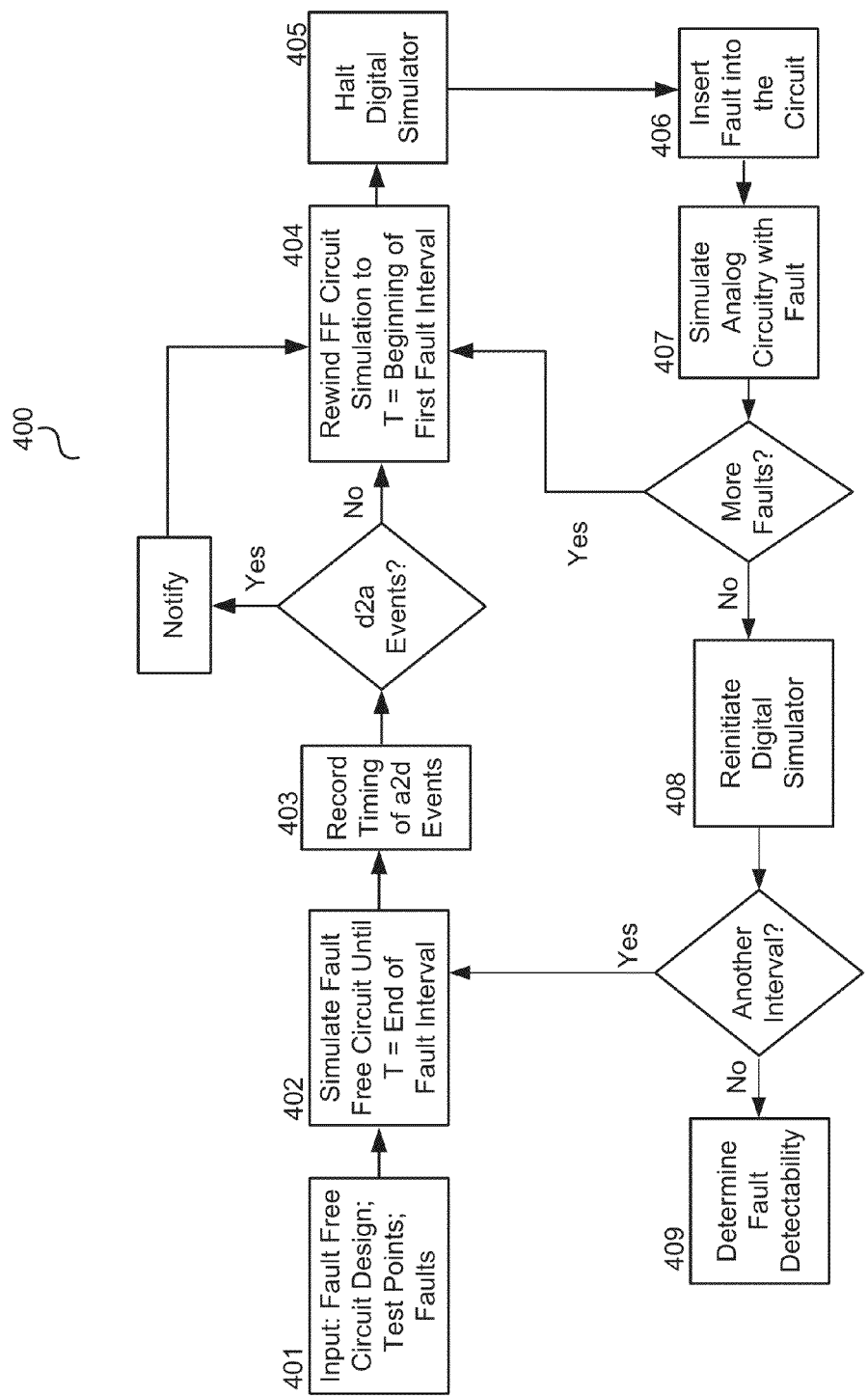
FIG. 4 is a flow chart illustrating a method of implementing the mixed signal fault sensitivity analysis (FSA) 400 optimized for analyzing fault intervals which include analog to digital events.

FIG. 4 is a flow chart illustrating a method of implementing the mixed signal fault sensitivity analysis (FSA) 400. In this particular method, FSA 400 is optimized for analyzing fault intervals with analog to digital events, but not digital to analog events. At 401, similarly to 201 of FIG. 2, a user provides a fault free circuit design with desired test points and faults for simulation.

At 402, a mixed signal simulator simulates the fault free circuit from an initial time point until the end of the first fault injection interval. At 403, FSA 400 records the points in time that the analog to digital events occur, and the circuit nodes involved. FSA 400 will also determine whether a digital to analog event occurs. If the simulator records any digital to analog events during the fault injection interval, the simulator warns the user that the analysis may not be accurate because FSA 400 may not account for these events.

At 404, FSA 400 rewinds the fault free simulation to the beginning of the fault injection interval. At 405, FSA 400 halts the digital portion of the mixed signal simulator. At 406, FSA 400 injects a fault into the analog portion of the fault free circuit. At 407, using the state of the fault free circuit simulation at the beginning of the fault interval, FSA 400 may simulate the circuit using the analog simulator kernel of the mixed-signal simulator until the end of the fault injection interval. During the simulation, the mixed-signal simulator may record the states of the faulty circuit along with the timing of any analog to digital events and affected nodes.

403-407 are repeated for every fault. Once the simulator has simulated every fault for the first fault interval, the digital kernel is reinitiated at 408. The simulator, using the original fault free state, continues the fault free simulation until the next fault injection interval. FSA 400 then repeats 402-408 for every fault injection interval. At 409, FSA 400 determines whether any of the faults were detectable by comparing the circuit outputs of the fault free simulation against the faulty simulations of each fault. FSA 400 may implement some of the techniques described with FIG. 2 to conduct any of the steps in FIG. 4. In one embodiment, FSA 400 may compare the timing of the logged analog to digital events in the fault free circuit simulation with the faulty circuit simulation. If the simulation of the faulty circuit contains analog to digital events at different times or different nodes from the fault free circuit, FSA 400 may consider this a detectable fault. In one embodiment, if the simulation of the faulty circuit is found to be missing analog to digital events or contains extra unexpected analog to digital events (as compared to the fault free circuit case), 400 may consider this a detectable fault. FSA 400 may also take into account whether any analog to digital events occurred and whether these would affect the digital portions of the IC.

Figure 5:
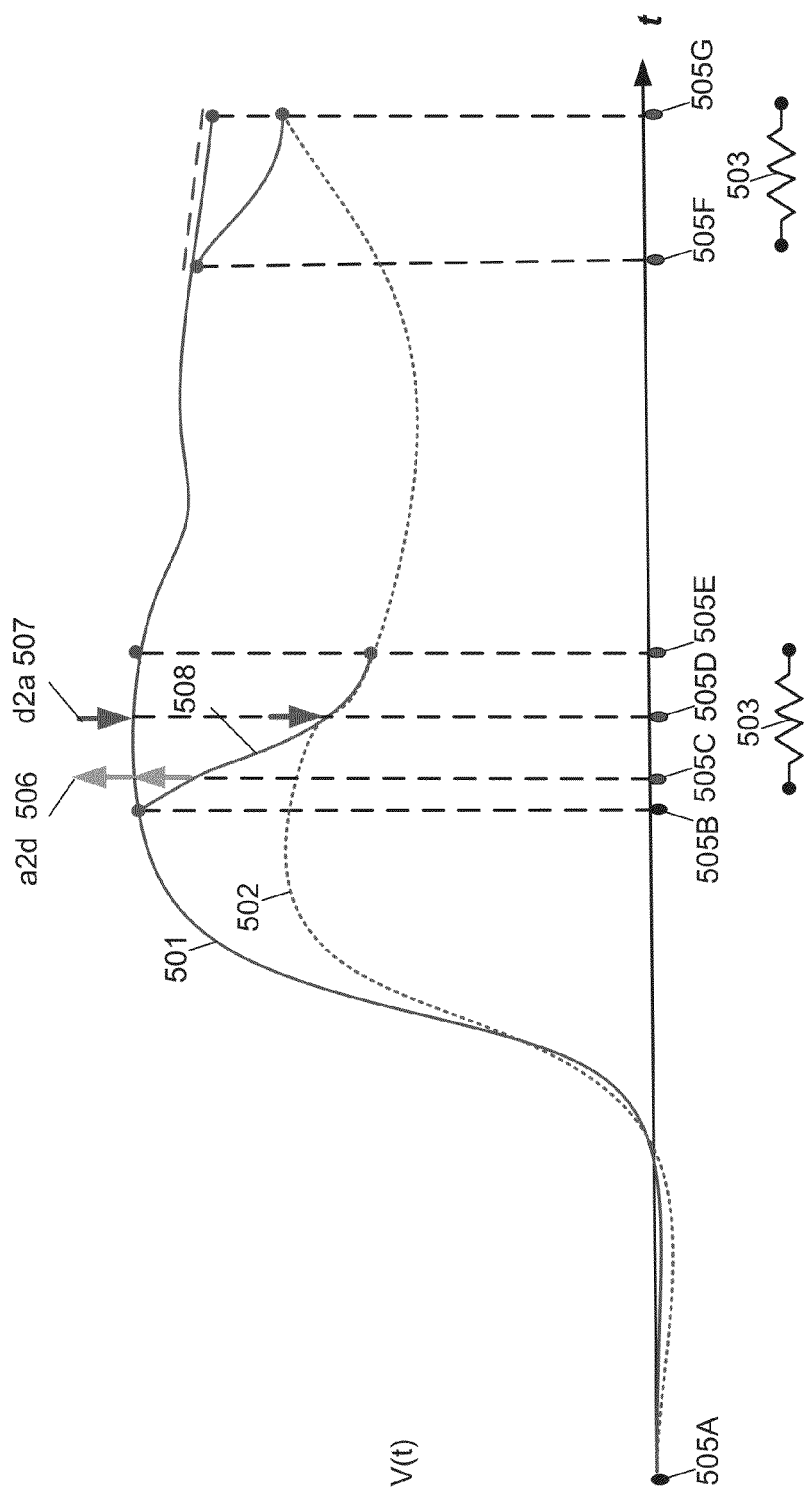
FIG. 5 is an exemplary transient graph of a simulated circuit behavior used to describe the mixed signal fault sensitivity analysis method used in FIG. 4

FIG. 5 is used to trace the simulation portion of FSA 400 in FIG. 4 along a graph of a circuit's transient values. Like FIG. 3, FIG. 5 shows a graph of a simulated circuit's voltage response (y axis) over time (x axis). Solid line 501 is the circuit simulation of a fault free circuit. Dashed line 502 represents the voltage response if the circuit with fault 503 existed. Interval 505B to 505E and 505F to 505G are the intervals used for injecting fault 503.

FSA 400 starts by simulating the fault free circuit from start time 505A to the end of the first fault interval 505E. Solid line 501 from 505A to 505E would be the results from the fault free simulation. Within the first fault interval, the FSA 400 would detect analog to digital event 506 at time 505C, and would record the affected nodes and the timing of the analog to digital event.

Also, because there is a digital to analog event 507 at time 505D within the fault injection interval 505B to 505E, FSA 400 would notify the user. In one embodiment, the notification may simply be just that. In another embodiment, the notification may be a warning. Next FSA 400 would rewind the simulation to the fault free solution at 505B, freeze the digital kernel of the mixed signal simulator, inject the fault, and simulate the faulty circuit until 505E. Line 508 represents FSA 400's simulation solution of the faulty circuit. If there were additional faults to be simulated in this interval, they may be analyzed in the same way. Once simulation of all the faulty circuits is complete, FSA 400 unfreezes the digital kernel and continues the fault free simulation until 505F, as represented by solid line 501 between 505E to 505F. FSA 400 then does a similar analysis for the next fault injection point.

Figure 6:
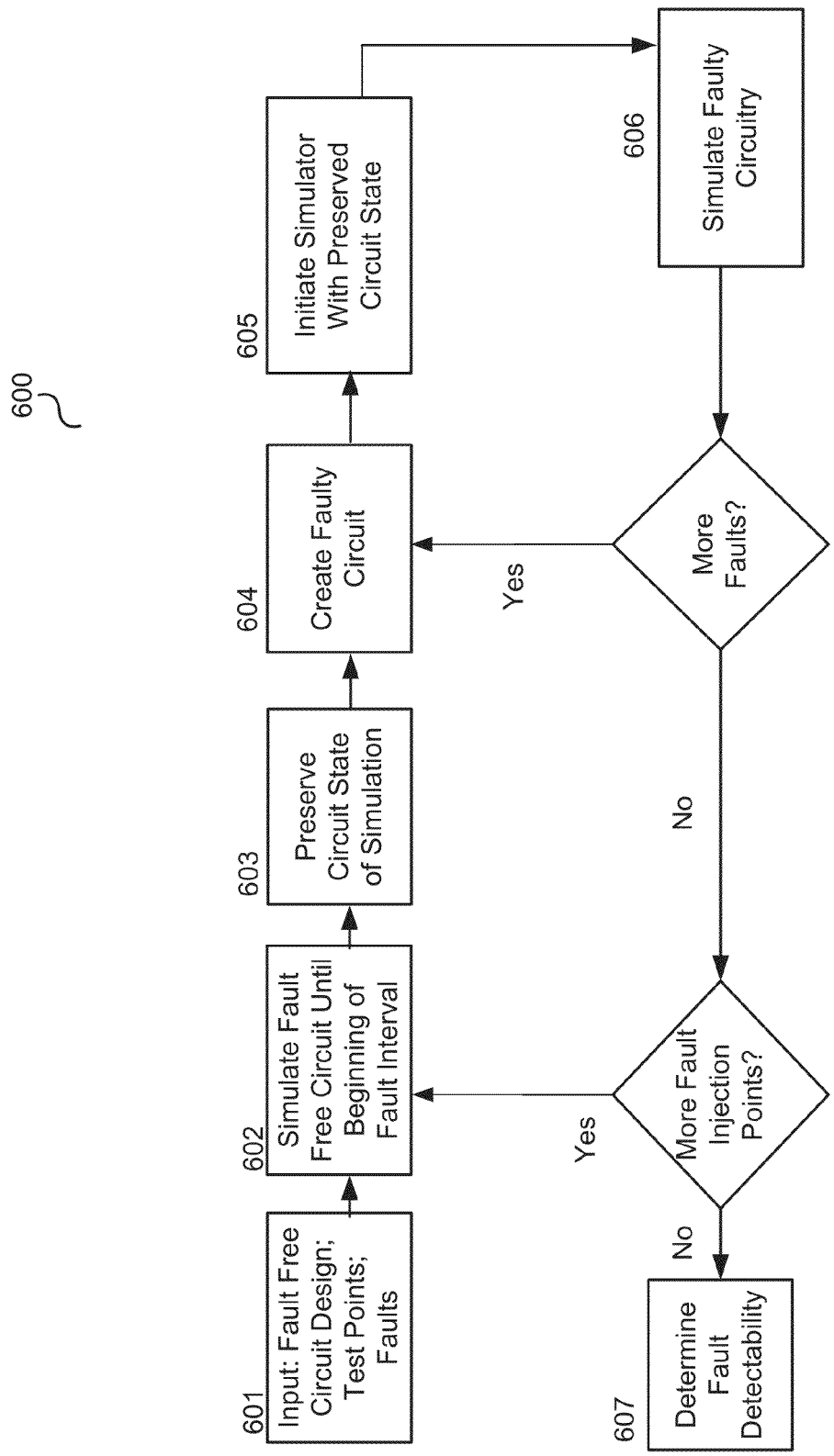
FIG. 6 is a flow chart illustrating a method of implementing the mixed signal fault sensitivity analysis (FSA) 600 optimized for analyzing fault intervals which include either analog to digital or digital to analog events occur.

FIG. 6 is a flow chart illustrating a method of implementing the mixed signal fault sensitivity analysis (FSA) 600. In this particular method, FSA 600 is optimized for analyzing fault intervals irrespective of whether there are analog to digital or digital to analog events. At 601, a user provides a fault free circuit design with desired test points and faults for simulation, similarly to what is shown in FIG. 2 and FIG. 4. At 602, FSA 600 uses a mixed signal simulator to simulate the circuit from an initial time point until the beginning of a fault interval. At 603 FSA 600 preserves the fault-free state of the complete mixed signal simulation at the beginning of the fault interval such that the state may be restored in another simulation. In one embodiment, the state may be preserved by serializing all the simulation data and values to a computer readable medium. Another method may be by cloning the circuit state during simulation by using an operation such as fork( ) to spawn identical child processes. At 604, FSA 600 creates faulty circuitry by introducing the user specified faults into the fault free circuit design for the particular fault interval. At 605, FSA 600 initiates the mixed signal simulator with the preserved fault free circuit state. At 606, the mixed signal simulator simulates the faulty circuitry for the fault interval. This is repeated for every fault and every fault interval. When there are no more faults and fault intervals for simulation, FSA 600 determines whether any of the faults were detectable at 607. In one embodiment, FSA 600 may determine the detectability of a fault may by comparing the circuit outputs of the fault free simulation against the circuit outputs of the faulty simulations. In another embodiment, FSA 600 detection methods may include the methods used in FSA 200 of FIG. 2 and FSA 400 of FIG. 4.

Figure 7:
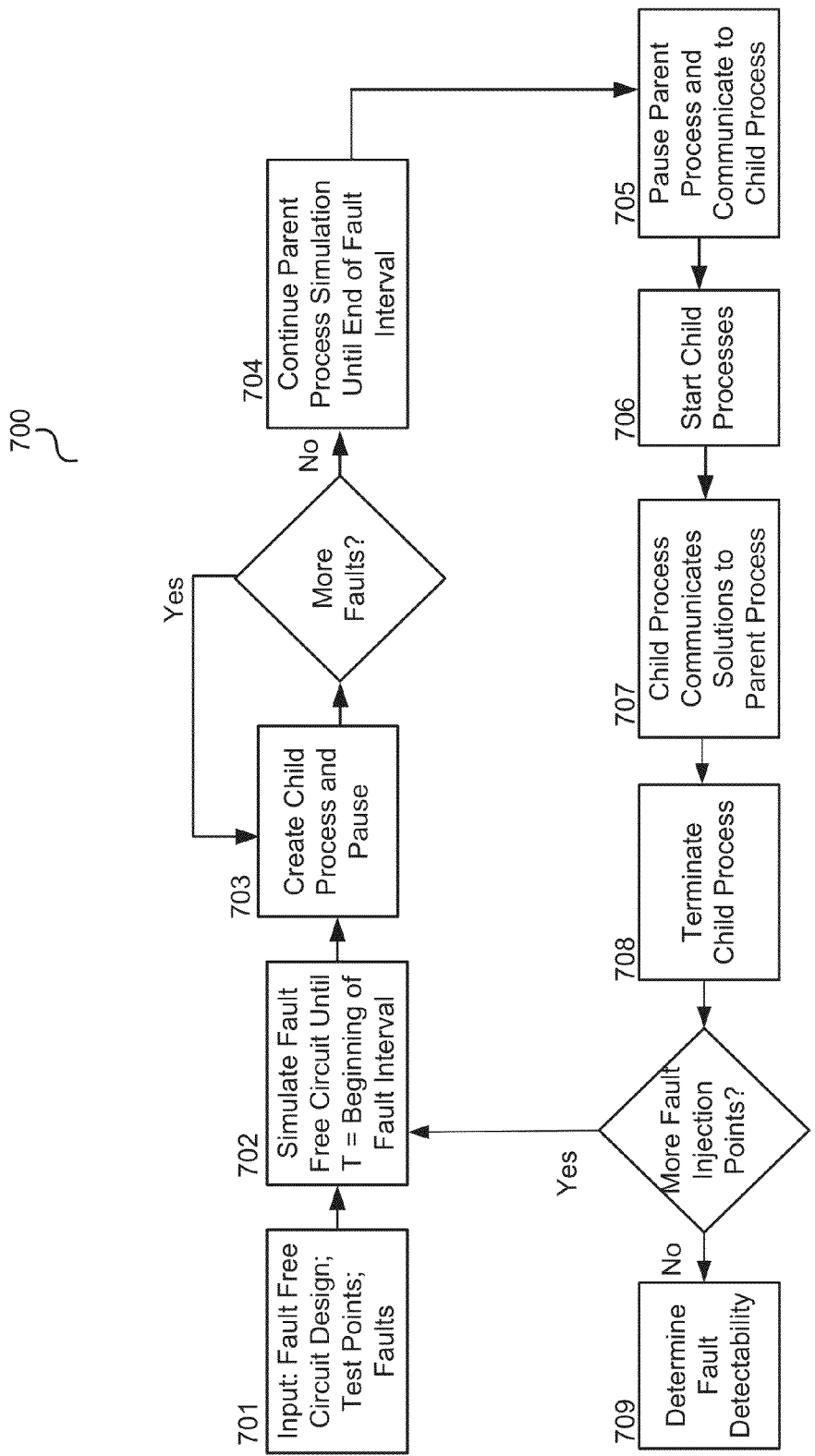
FIG. 7 is a flow chart illustrating a method of implementing the mixed signal fault sensitivity analysis (FSA) 700 optimized for analyzing fault intervals which include either analog to digital or digital to analog events occur by using sub processes to preserve simulation states.

FIG. 7 is a flow chart illustrating another method of implementing the mixed signal FSA, this time denoted 700, which spawns child processes to preserve circuit states. As with the previously-described method of FIG. 6, FSA 700 is optimized for analyzing fault intervals irrespective of whether there are analog to digital or digital to analog events. At 701, a user provides a fault free circuit design with desired test points and faults for simulation, similarly to what is shown in FIG. 2 and FIG. 4. At 702, FSA 700 uses a mixed signal simulator to simulate the circuit from an initial time point until the beginning of a fault interval. At 703 FSA 700 creates a child process, which can be achieved via a call to an OS function such as a fork( ). The child process spawns additional child clone processes for each fault expected to be simulated for that interval. The child processes are paused and wait for a signal from the parent process to move forward. At 704, the parent process continues with the fault free simulation up until the end of the fault interval. At 705, the parent process stops its simulation and communicates information to the child process through inter process communication. The information may include how long the parent process took to simulate the fault interval, mixed signal events that occurred during the simulation, and a signal to start the child processes. The parent process then waits until the child process is completed. At 706, the additional child processes insert faults into the analog portion of the circuit design and conduct a full mixed-signal simulation of the faulty circuits for the fault interval. Using fork( ), the additional child processes can simply continue simulating, as each additional forked child process already contains the fault-free simulation state. In non-fork-based alternative embodiments, the fault-free simulation circuit state may need to be preserved and explicitly applied by each additional child process. In one embodiment, the state may be preserved by saving the circuit state on a computer readable medium and apply the circuit state in a child process by loading the preserved state into the simulator before simulating the faulty circuitry. In one embodiment, loading the simulation state may be conducted by overwriting all state-related data in the simulator with the preserved state data. During the simulations, the additional child processes gather information about any interfaces between the analog and digital circuitry such as timing, amount of CPU time used, digital circuit values, and analog circuit values.

In one embodiment, the child processes use the information provided by the parent process to perform fault detection decisions and may terminate a child process before the end of its simulation if the simulation takes excessive CPU effort or if there are significant differences in analog to digital or digital to analog events compared to the fault free case. The first child process then gathers the fault simulation solutions from the additional child processes. Once the child processes have completed all the simulations, the results from the child processes are gathered and communicated back to the parent process at 707. At 708, the parent process terminates the child processes and continues the simulation until the next fault injection point. 702-708 are repeated for every fault injection point. At 709, FSA 700 determines whether any of the faults were detectable by comparing the circuit outputs of the fault free simulation against the circuit outputs of the faulty simulations. Some of the detection methods used may include the methods used in FSA 200 of FIG. 2 and FSA 400 of FIG. 4.

Figure 8:
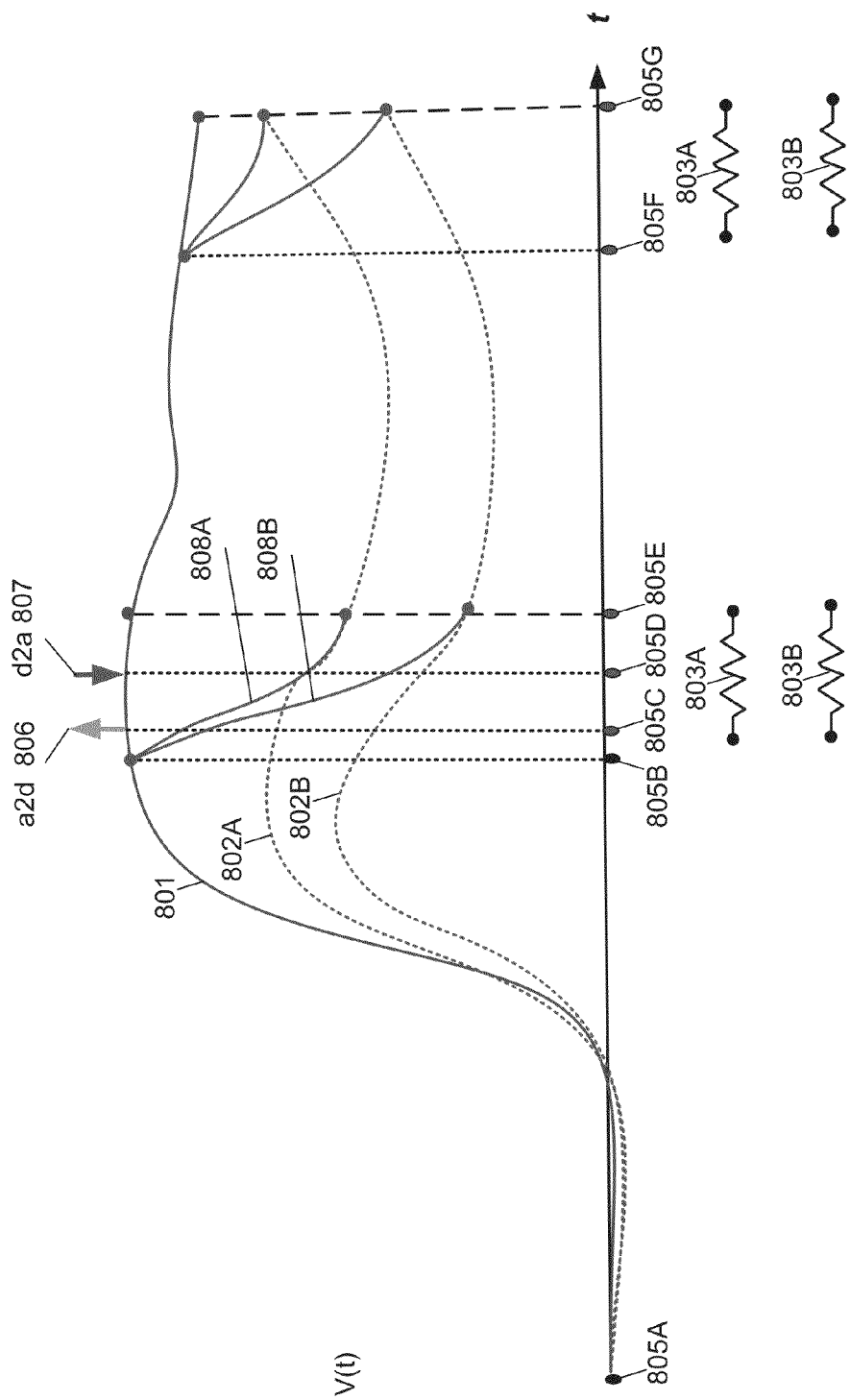
FIG. 8 is an exemplary transient graph of a simulated circuit behavior used to describe the mixed signal fault sensitivity analysis method in FIG. 7.

FIG. 8 is used to trace the simulation portion of FSA 700 in FIG. 7 along a graph of a circuit's transient values. Like FIGS. 3 and 5, a graph of a simulated circuit's voltage response (y axis) over time (x axis) is shown. Solid line 801 is the circuit simulation of a fault free circuit. Dashed line 802A represents the voltage response if the fault free circuit had fault 803A. Similarly, dashed line 802B represents the voltage response if the fault free circuit had fault 803B. The simulator uses interval 805B to 805E and 805F to 805G for injecting faults 803A and 803B.

FSA 700 starts by simulating the fault free circuit from start time 805A to the beginning of the first fault interval 805B. Solid line 801 from 805A to 805B would be the results from the fault free simulation. At this point FSA 700 forks a first child process which forks two more sub-processes (additional child processes), one for each fault. FSA 700 then continues the parent process's simulation of the fault free circuit until the end of the first fault interval 805E. FSA 700 would detect analog to digital event 806 at time 805C and digital to analog event 807 at time 805D and record the affected nodes and the timing of the events. FSA 700 then halts the parent process and communicates the results of the fault free simulation to the first child process.

Next, FSA 700 injects a fault 803A into the analog portion of the circuit for simulation by one sub-process and injects fault 803B into the circuit for simulation by the other sub-process. The sub-processes may use the circuit state of the fault free circuit simulation at time 805B to start their simulations and simulate the faulty circuitry until time 805E. Line 808A represents FSA 700's circuit simulation solution for the circuit with fault 803A for interval 805B to 805E. Line 808B represents FSA 700's circuit simulation solution for the circuit with fault 803B for interval 805B to 805E. During the simulation of the faulty circuitry, the child processes may compare the amount of CPU time required to conduct the simulation of the faulty circuitry against the fault free simulation and exit out of the simulation early if the faulty circuitry simulation CPU time was excessively longer. Once simulation of all the faulty circuits is complete, FSA 700 records the circuit states of the faulty circuit simulations and terminates the child processes. FSA 700 then continues the main process with the fault free simulation until 805F, as represented by solid line 801 between 805E to 805F. FSA then does a similar analysis for the next fault injection point.

In one embodiment of a fault sensitivity analysis system, a user may be able to choose which analysis optimization to use. For example, a user may desire to only conduct fault sensitivity analysis of a circuit during time intervals where neither analog to digital nor digital to analog events occur. Fault sensitivity analysis optimized to ignore analog to digital and digital to analog events may be used in this situation because the system may conduct the analysis quicker using this optimization. A user may use whichever optimization best suits the user's purposes. According to an aspect of an embodiment, after fault sensitivity analysis is conducted, full simulation—rather than a fault interval simulation—may be conducted for faults that are considered detectable.

While particular embodiments of the present invention have been described, it is to be understood that various different modifications within the scope and spirit of the invention are possible. The invention is limited only by the scope of the appended claims.

What is claimed is:

1. A computer implemented method for conducting fault sensitivity analysis of a mixed signal circuit design having analog portions and digital portions, the method comprising:
   receiving a fault free mixed signal circuit design for a mixed signal integrated circuit, a fault, and a fault interval time period;
   during a single fault sensitivity analysis simulation run, within a simulator:
   using a computer, simulating the fault free mixed signal circuit design with a mixed signal circuit simulator from an initial circuit simulation time point until the end of the fault interval time period;

freezing a digital kernel of the mixed signal circuit simulator;

inserting the fault into an analog portion of the fault free mixed signal circuit design; and using a computer, simulating the fault free mixed signal circuit design with the fault, using the mixed signal circuit simulator, only from the beginning of the fault interval time period until the end of the fault interval time period; and determining whether the fault is detectable.

2. The method of claim 1 wherein simulating the fault free mixed signal circuit design with a mixed signal circuit simulator from an initial circuit simulation time point until the end of the fault interval time period comprises:

logging any digital to analog events which occur within the fault interval time period and, if any digital to analog events occur, providing a user notification.

3. The method of claim 2 wherein simulating the fault free mixed signal circuit design with the fault from the beginning of the fault interval time period until the end of the fault interval time period comprises:

simulating only the analog portions of the mixed signal circuit design during the fault interval; and if any analog to digital events occur, recording a time of occurrence.

4. The method of claim 2 wherein simulating the fault free mixed signal circuit design with a mixed signal circuit simulator from an initial circuit simulation time point until the end of the fault interval time period further comprises:

logging any analog to digital events which occur within the fault interval time period and if any digital to analog events occur, providing a notification.

5. The method of claim 1 wherein simulating the fault free mixed signal circuit design with a mixed signal circuit simulator from an initial circuit simulation time point until the end of the fault interval time period comprises:

preserving a state of the mixed signal simulation of the fault free circuit at the beginning of the fault interval such that the state may be restored in another simulation.

6. The method of claim 1 further comprising:

during the single fault sensitivity analysis simulation run:

using a computer, simulating the fault free mixed signal circuit design with the mixed signal circuit simulator from a different initial circuit simulation time point until the end of a different fault interval time period;

inserting a different fault into the analog portion of the fault free mixed signal circuit design; and using a computer, simulating the fault free mixed signal circuit design with the different fault, using the mixed signal circuit simulator, only from the beginning of the different fault interval time period until the end of the different fault interval time period; and determining whether the different fault is detectable.

7. The method of claim 6 wherein the different initial circuit simulation time point is the end of a previous fault interval time period.

8. The method of claim 1 wherein the determining whether the fault is detectable comprises at least one of detecting an unexpected analog to digital event, and detecting excessive differences in Central Processing Unit (CPU) time required to simulate the fault free mixed signal circuit design and the fault free mixed signal circuit design with the fault.

9. A non-transitory computer readable medium storing instructions that, when executed by a processor, perform a method for conducting fault sensitivity analysis of a mixed signal circuit design having analog portions and digital portions, the method comprising:

in response to receiving a fault free mixed signal circuit design for a mixed signal integrated circuit, a fault, and a fault interval time period:

during a single fault sensitivity analysis simulation run, within a simulator:

simulating the fault free mixed signal circuit design with a mixed signal circuit simulator from an initial circuit simulation time point until the end of the fault interval time period;

freezing a digital kernel of the mixed signal circuit simulator;

inserting the fault into an analog portion of the fault free mixed signal circuit design; and simulating the fault free mixed signal circuit design with the fault using a mixed signal circuit simulator only from the beginning of the fault interval time period until the end of the fault interval time period; and determining whether the fault is detectable.

10. The method of claim 9 wherein simulating the fault free mixed signal circuit design with a mixed signal circuit simulator from an initial circuit simulation time point until the end of the fault interval time period comprises:

logging any digital to analog events which occur within the fault interval time period and if any digital to analog events occur, providing a notification.

11. The method of claim 10 wherein simulating the fault free mixed signal circuit design with the fault from the beginning of the fault interval time period until the end of the fault interval time period comprises:

simulating only the analog portions of the mixed signal circuit design during the fault interval; and if any analog to digital events occur, recording a time of occurrence.

12. The method of claim 10 wherein simulating the fault free mixed signal circuit design with a mixed signal circuit simulator from an initial circuit simulation time point until the end of the fault interval time period further comprises:

logging any digital to analog events and any analog to digital events which occur within the fault interval time period and if any digital to analog events occur, providing a notification.

13. The method of claim 12 wherein simulating the fault free mixed signal circuit design with a mixed signal circuit simulator from an initial circuit simulation time point until the end of the fault interval time period comprises:

preserving a state of the mixed signal simulation of the fault free circuit at the beginning of the fault interval such that the state may be restored in another simulation.

14. A system for conducting fault sensitivity analysis of a mixed signal circuit design having analog portions and digital portions, the system comprising:

non-transitory computer-readable media to store a fault free mixed signal circuit design, circuit simulation results, fault list and attributes, user inputs, and EDA software; and a processor executing instructions to:

during a single fault sensitivity analysis simulation run, within a simulator:

simulate the fault free mixed signal circuit design with a mixed signal circuit simulator from an initial circuit simulation time point until the end of the fault interval time period;

freeze a digital kernel of the mixed signal circuit simulator;

insert a fault from the fault list into an analog portion of the fault free mixed signal circuit design; and simulate the fault free mixed signal circuit design with the fault using a mixed signal circuit simulator only from the beginning of the fault interval time period until the end of the fault interval time period; and determine whether the fault is detectable.

15. The system of claim 14 wherein instructions to simulate the fault free mixed signal circuit design with a mixed signal circuit simulator from an initial circuit simulation time point until the end of the fault interval time period comprise instructions to:

store on the computer readable media, digital to analog events which occur within the fault interval time period during a simulation; and provide a notification if any digital to analog events occur.

16. The system of claim 14 wherein instructions to simulate the fault free mixed signal circuit design with the fault from the beginning of the fault interval time period until the end of the fault interval time period comprise instructions to:

simulate only the analog portions of the mixed signal circuit design during the fault interval; and if any analog to digital events occur, recording a time of occurrence.

17. The system of claim 14 wherein instructions to simulate the fault free mixed signal circuit design with a mixed signal circuit simulator from an initial circuit simulation time point until the end of the fault interval time period comprise instructions to:

store on the computer readable media any digital to analog events and any analog to digital events which occur within the fault interval time period during a simulation; and provide a notification if any at least one of digital to analog events and analog to digital events occur within the fault interval time period.

18. The system of claim 17 wherein instructions to simulate the fault free mixed signal circuit design with the fault from the beginning of the fault interval time period until the end of the fault interval time period comprise instructions to:

preserve a state of the mixed signal simulation of the fault free circuit at the beginning of the fault interval such that the state may be restored in another simulation.

19. The method of claim 1 further comprising:

during the single fault sensitivity analysis simulation run:

inserting a different fault into the analog portion of the fault free mixed signal circuit design; and using a computer, simulating the fault free mixed signal circuit design with the different fault, using the mixed signal circuit simulator, only from the beginning of the fault interval time period until the end of the fault interval time period; and determining whether the different fault is detectable.

* * * * *